US006831957B2

(12) United States Patent
Chen

(10) Patent No.: US 6,831,957 B2
(45) Date of Patent: Dec. 14, 2004

(54) SYSTEM AND METHOD OF DUAL MODE AUTOMATIC GAIN CONTROL FOR A DIGITAL RADIO RECEIVER

(75) Inventor: Zhiliang Julian Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 771 days.

(21) Appl. No.: 09/805,825

(22) Filed: Mar. 14, 2001

(65) Prior Publication Data

US 2002/0168037 A1 Nov. 14, 2002

(51) Int. Cl.[7] .............................................. H04L 27/08
(52) U.S. Cl. ...................................... 375/345; 455/138
(58) Field of Search ................................. 375/316, 326, 375/327, 339, 344, 345; 455/196.1, 131, 182.1, 138, 139, 130, 232.1, 234.1, 252, 255, 257, 263

(56) References Cited

U.S. PATENT DOCUMENTS

| | | | | |
|---|---|---|---|---|
| 5,168,507 | A | * | 12/1992 | Critchlow et al. .......... 375/231 |
| 5,513,387 | A | | 4/1996 | Saito et al. |
| 5,546,138 | A | * | 8/1996 | Krishnamurthy et al. ... 348/735 |
| 5,638,141 | A | * | 6/1997 | Bae et al. .................... 348/735 |
| 5,862,465 | A | * | 1/1999 | Ou .............................. 455/234.1 |
| 6,041,081 | A | * | 3/2000 | O et al. ....................... 375/297 |
| 6,107,878 | A | * | 8/2000 | Black ............................ 330/129 |
| 6,236,848 | B1 | * | 5/2001 | Igarashi et al. ............. 455/341 |
| 6,459,889 | B1 | * | 10/2002 | Ruelke ........................ 455/296 |
| 6,463,266 | B1 | * | 10/2002 | Shohara .................... 455/196.1 |
| 6,516,185 | B1 | * | 2/2003 | MacNally ................ 455/234.1 |
| 6,560,448 | B1 | * | 5/2003 | Baldwin et al. .......... 455/234.1 |
| 6,650,878 | B1 | * | 11/2003 | Abe et al. ................. 455/232.1 |
| 6,694,129 | B2 | * | 2/2004 | Peterzell et al. ............. 455/76 |
| 6,735,416 | B1 | * | 5/2004 | Marko et al. .............. 455/3.02 |
| 6,738,601 | B1 | * | 5/2004 | Rofougaran et al. ....... 455/66.1 |
| 2002/0072329 | A1 | * | 6/2002 | Bandeira et al. ............... 455/7 |
| 2002/0086707 | A1 | * | 7/2002 | Struhsaker et al. ......... 455/561 |

FOREIGN PATENT DOCUMENTS

| | | |
|---|---|---|
| EP | 0913934 A2 | 5/1999 |
| EP | 0999649 A2 | 5/2000 |
| WO | WO 00/18023 | 3/2000 |

* cited by examiner

Primary Examiner—Emmanuel Bayard
(74) Attorney, Agent, or Firm—W. Daniel Swayze, Jr.; W. James Brady; Frederick J. Telecky, Jr.

(57) ABSTRACT

A digital radio receiver system uses a dual mode automatic gain control architecture and method to enhance signal-to-noise ratio and linearity to accommodate reception and processing of both L-band RF signals and band-III RF signals. The system architecture employs an analog AGC to control high/low gain switches associated with front end low noise amplifiers and down converters, as well as a digital AGC to control gain controlled amplifier and programmable gain amplifier gain settings. The AGC control can be implemented totally within the system architecture or optionally can be implemented via an external data processing device such as a DSP or micro-controller.

30 Claims, 6 Drawing Sheets

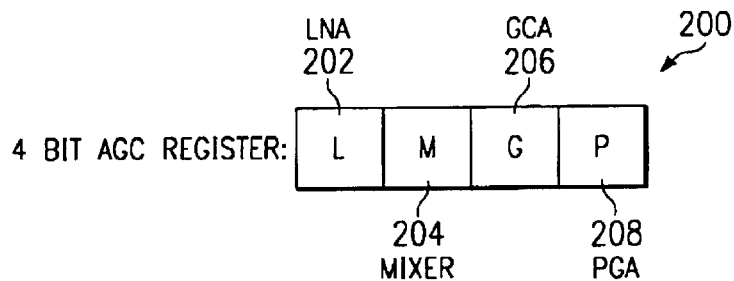
FIG. 2
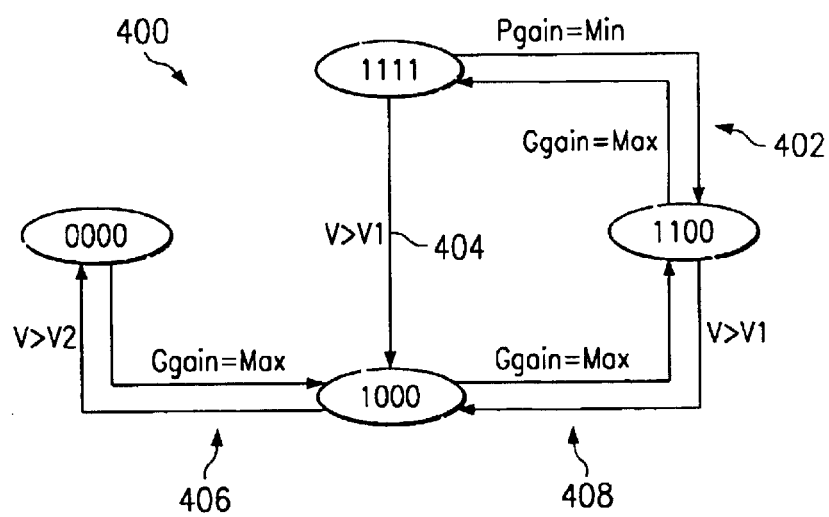
FIG. 3
FIG. 4

SYSTEM AND METHOD OF DUAL MODE AUTOMATIC GAIN CONTROL FOR A DIGITAL RADIO RECEIVER

BACKGROUND OF THE INVENTION

1. Field of the Invention

This invention relates generally to automatic gain controls (AG), and more particularly to a system and method of dual mode AGC for a digital radio receiver.

2. Description of the Prior Art

A digital radio broadcast system requires a radio frequency (RF) receiver having a high sensitivity and wide input dynamic range to cope with a wide range of RF input signal strengths. This requirement for a wide input dynamic range can only be met if the RF receiver has good linearity through the full RF receiver path over the required wide range of RF input signal strengths. The requirement to meet both high sensitivity and high linearity has been particularly problematic regarding RF receiver architectures and optimization.

In view of the foregoing, a need exists in the RF receiver art for an AGC architecture and method to optimize a digital radio receiver system such that it will achieve high input signal sensitivity and high linearity over a wide range of RF input signal strengths.

SUMMARY OF THE INVENTION

The present invention is directed to a system architecture and method of implementing dual mode automatic gain control for a digital radio receiver in order to achieve high input signal sensitivity and high linearity over a wide range of RF input signal strengths. The architecture most preferably comprises a complete integrated RF dual band receiver solution for digital audio broadcast (DAB). According to one embodiment, the dual band receiver system architecture includes a pair of dual band low noise amplifiers (LNA), three down converters, an IF gain controlled amplifier (GCA), a programmable gain amplifier (PGA), a 10-bit analog-to-digital converter (ADC), two voltage controlled oscillators (VCO), and two synthesizers. In order to accommodate a wide range input signal (i.e. ~-100 dBm to ~-10 dBm) at both band III and L-band antennas, the LNAs and the first down converter mixers are designed with a two-mode architecture capable of implementing both high and low gain mode control, depending upon the strength of the input signal.

Two AGC control algorithms are implemented within the system to ensure a high system linearity and to obtain an optimum system signal-to-noise ratio for a wide range (i.e. ~-100 dBm to ~-10 dBm) of input signals. The high/low gain mode switches of LNAs and mixers are controlled by a RF AGC, while a digital AGC controls the gain settings of the GCA and PGA to optimize the output signal to the requisite ADC input range.

As used herein, the following words have the following meanings. The words "Algorithm" and "algorithmic" mean functions that can be implemented using either "hardware" or "software" or a combination of both. The words "algorithmic software" mean an algorithmic program used to direct the processing of data by a computer or data processing device. The words "data processing device" as used herein refer to a CPU, DSP, microprocessor, microcontroller, or other like device and an interface system. The interface system provides access to the data processing device such that data could be entered and processed by the data processing device. The words "discrete data" as used herein are interchangeable with "digitized data" and "digitized data" as used herein means data which are stored in the form of singularly isolated, discontinuous data or digits.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIG. 2 illustrates a single four-bit register for indicating gain status of the LNAs, mixers, GCA and PGA depicted in the digital radio receiver in FIG. 1 where the MSB is the LNA bit, the second MSB is the mixer bit, the second LSB is the GCA bit, and the LSB is the PGA bit, according to one embodiment of the present invention;

FIG. 3 illustrates four different states of the single four-bit register depicted in FIG. 2 where the LSBs and MSBs are set to control four different gain modes (stages) according to one embodiment of the present invention;

FIG. 4 is a state diagram illustrating the conditions necessary to implement a transition from one gain mode (stage) to another using the four different states of the single four-bit register depicted in FIG. 3 according to one embodiment of the present invention;

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
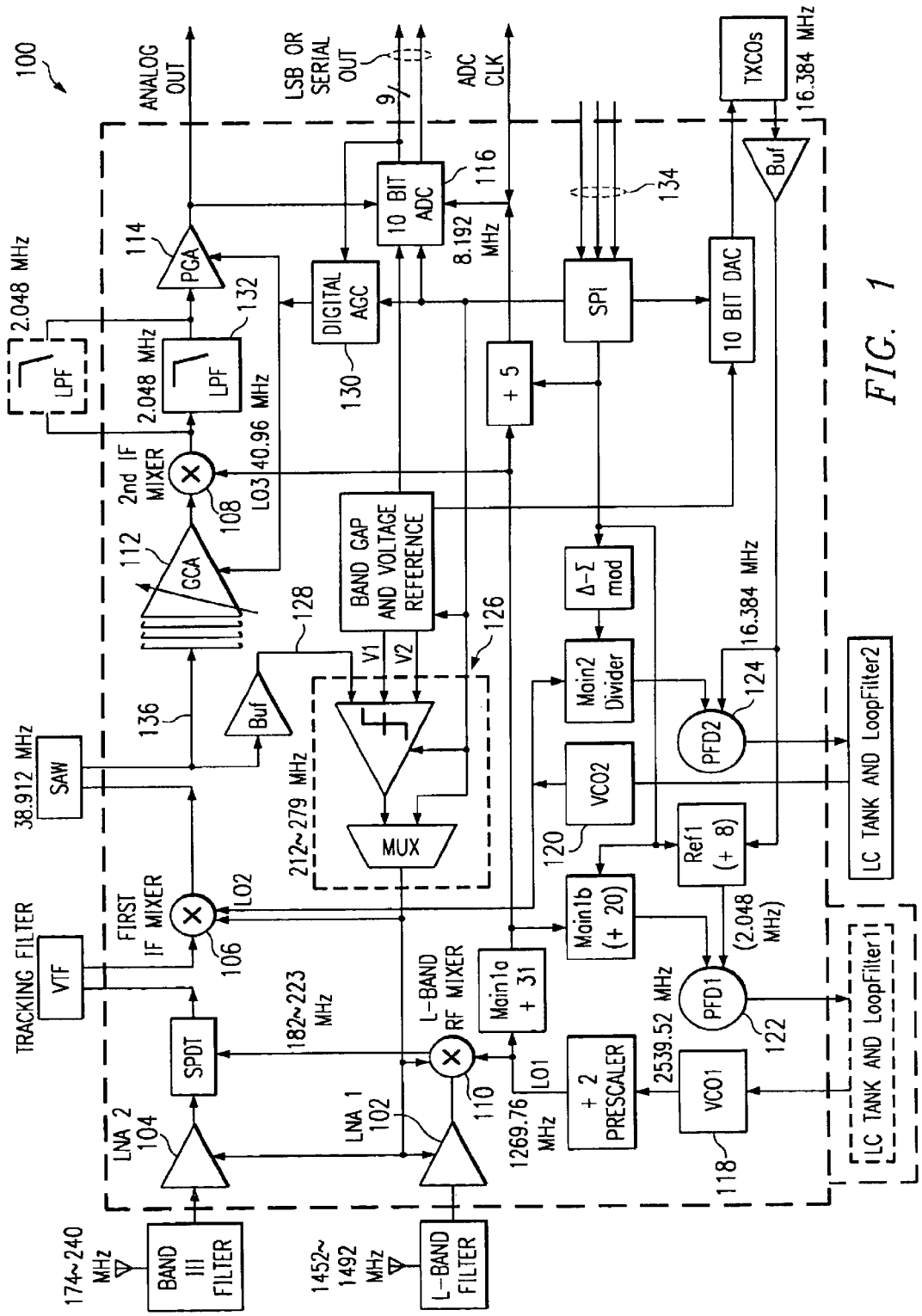
FIG. 1 is a block diagram illustrating a digital radio receiver with a dual mode automatic gain control system to achieve high input signal sensitivity and high linearity over a wide range of RF input signal strengths according to one embodiment of the present invention.

FIG. 1 is a block diagram illustrating a digital radio receiver 100 with a dual mode automatic gain control system to achieve high input signal sensitivity and high linearity over a wide range of RF input signal strengths according to one embodiment of the present invention. The digital radio receiver 100 includes a pair of dual band low noise amplifiers (LNAs) 102, 104, three down converters (mixers) 106, 108, 110, an IF gain controlled amplifier (CGA) 112, a programmable gain amplifier (GPA) 114, a 10-bit ADC 116, two VCOs 118, 120, and two synthesizers 122, 124. The LNAs 102, 104 and the first down converter mixers 106, 110 are implemented via a two-mode architecture having a high gain mode and a low gain mode control 126 that is dependent upon the strength of the input signal 128.

Two automatic gain control algorithms are implemented to ensure a high system 100 linearity and to obtain an optimum system 100 signal-to-noise ratio for a wide input signal range, as stated herein before. The high/low gain mode switches 126 of LNAs 102, 104 and mixers 106, 110 can be seen to be controlled by a RF AGC, while a digital AGC 130 controls the gain settings of GCA 112 and PGA 114 to optimize the PGA 114 output signal to ADC 116 input range.

Table I below shows four stages of gain control for the system 100 according to one preferred embodiment.

Four 1-bit registers are therefore needed in the receiver system 100 to indicate the status of each gain block since only one LNA operates at any moment in time according to the present embodiment. Five one-bit registers would be necessary if the LNAs 102, 104 were allowed to function simultaneously. FIG. 2 illustrates a single four-bit register 200 for indicating gain status of the LNAs 102, 104, mixer 106, GCA 112 and PGA 114 depicted in the digital radio receiver 100 shown in FIG. 1, where the MSB 202 is the LNA bit, the second MSB 204 is the mixer bit, the second LSB 206 is the GCA bit, and the LSB 208 is the PGA bit, according to one embodiment of the present invention. This single four-bit register 200 is used to help implement an AGC control algorithm capable of controlling the receiver system 100 such that it can achieve high input signal sensitivity and high linearity over a wide range of RF input signal strengths as stated herein before. According to one embodiment, a "1" bit indicates a high gain status for both LNA and Mixer1, while a "0" bit indicates low gain status. Further, according to one embodiment, a "1" bit indicates a maximum gain of 40 dB for GCA 112, while a "0" bit indicates the GCA 112 gain can be adjustable between 0~40 dB. Regarding PGA 114, a "0" bit indicates a minimum gain of 0 dB while a "1" bit indicates PGA 114 gain can be

TABLE I

| Pin (dBm) | GCA input (Vp-p) | Pout (Vp-p) | C/N (dB) | Control Stage |
|---|---|---|---|---|
| −100.00 | 0.00019 | 0.85 | 7.71 | Stage I: LNA, Mixer I: high gain |
| −90.00 | 0.00060 | 0.85 | 19.99 | PGA = 18 to ~ 0 (dB) |
| −82.00 | 0.00150 | 0.85 | 25.71 | |
| −81.00 | 0.00169 | 0.85 | 26.61 | Stage II: LNA, Mixer I: high gain |
| −57.00 | 0.02673 | 0.85 | 36.11 | PGA = 0, GCA = 39 to ~ 15 (dB) |
| −56.00 | 0.00300 | 0.85 | 35.85 | Stage III: Mixer I: low gain |
| −42.00 | 0.01503 | 0.85 | 36.24 | LNA: high gain |
| −31.00 | 0.05334 | 0.85 | 36.25 | PGA = 0, GCA = 34 to ~ 9 (dB) |
| −30.00 | 0.00598 | 0.85 | 36.15 | Stage IV: LNA, Mixer I: low gain |
| −10.00 | 0.05985 | 0.85 | 36.25 | PGA = 0, GCA = 28 to ~ 8 (dB) |

The present inventor discovered that positive channel fading effects on field strength must be considered. The output level of the LPF buffer 132 is therefore controlled to be 0.85 Vp-p, that is about −7.5 dB below the 2 Vp-p ADC 116 input range. The 0.85 Vp-p threshold is most preferably programmed in a fashion familiar to those skilled in the art of digital ADCs such that a real value of the threshold can be set when positive channel fading data becomes available, for example, from field tests.

The dual mode automatic gain control broadcast receiver system 100 most preferably does not allow any gain change within the RF chain during a packet (or symbol) receiving period. Instead, any gain change should be implemented during a packet (or symbol) interval period (e.g. 0.24 ms according to one embodiment). Such control can be achieved, for example, via a flag signal provided by a data processing unit such as a DSP. The flag signal could be presented, for example, at a dedicated DSP pin or could alternatively be presented to the receiver system 100 through its SPI bus 134 (if the SPI bus speed is fast enough).

The AGC 130 control can also be implemented using external data processing devices (e.g. DSP, micro-controller and the like). In this case, the internal AGC control loop is most preferably disabled through the SPI bus 134.

Table I shows that one embodiment of the present dual mode automatic gain control digital broadcast receiver 100 can be realized using four gain stages (I, II, III, IV) that are implemented with different combinations of four gain elements (LNA 102, 104, Mixer 106, GCA 112, PGA 114).

adjustable between 0~18 dB, according to one embodiment. The AGC register value corresponding to stage I, II, III and IV respectively are shown in FIG. 3 that illustrates four different states 302, 304, 306, 308 of the single four-bit register 200 depicted in FIG. 2, where the LSBs 206, 208 and MSBs 202, 204 are set to control four different gain modes (stages) according to one embodiment of the present invention. The analog AGC is controlled by monitoring GCA 112 input signal 136 and the digital AGC 130 is controlled by monitoring ADC 116 output code, as stated herein before. With continued reference now to Table I, there are two threshold values of GCA input 136 to determine the change of either Mixer 106 gain or LNA 102, 104 gain. The threshold values are V1=26 mV or V2=53 mV for both L-band receive mode and Band III receive mode. For digital AGC, a setting of 0.85 Vp-p ADC input signal results in 730 digital code on ADC 116 output (1024 digital output code for 2 Vp-p ADC input).

FIG. 4 is a state diagram 400 illustrating the conditions necessary to implement a transition from one gain mode (stage) to another using the four different states 302, 304, 306, 308 of the single four-bit register 200 depicted in FIG. 3 according to one embodiment of the present invention. It can be seen that most transitions occur between two stages. There is a possible transition, however, from stage 1111 to stage 1000 as well as from stage 1111 to stage 1100, when the input signal strength increases dramatically. The present inventor found that identifying the current state of the stage to be most important among the receiver system 100 variables, since it can be determined which gain needs to be adjusted in order to optimize the receiver system 100 so long as the status of the stage is known.

Figures 5, 6:
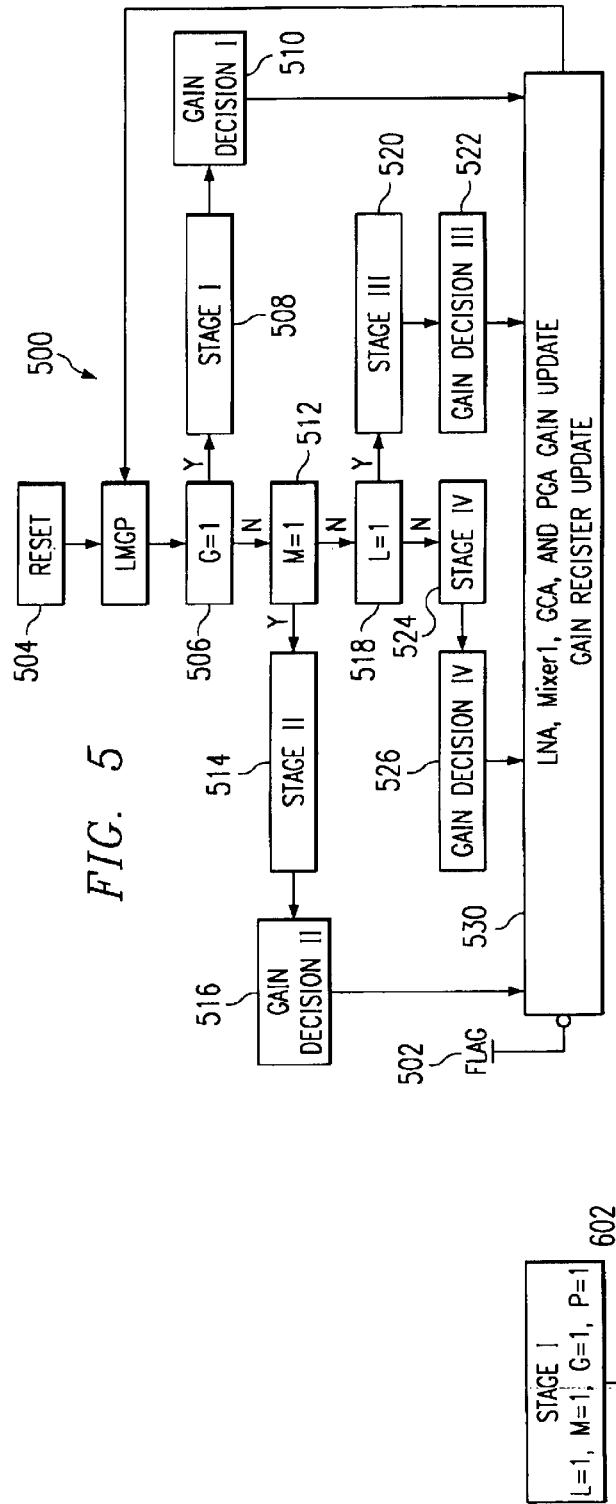
FIG. 5 is a flow chart illustrating an algorithmic procedure to identify stage status and implement gain decisions therefrom for the digital radio receiver depicted in FIG. 1 and using the system features illustrated in FIGS. 2–4 according to one embodiment of the present invention.
FIG. 6 is a flow chart illustrating an algorithmic procedure for implementing the stage I gain decision shown in FIG. 5 according to one embodiment of the present invention.

FIG. 5 is a flow chart illustrating an algorithmic procedure 500 to identify stage status and implement gain decisions therefrom for the digital radio receiver 100 depicted in FIG. 1 and using the system features illustrated in FIGS. 2–4 according to one embodiment of the present invention. The algorithmic procedure 500 determines the AGC register 200 value of L, M, G and P to selectively implement a stage I, II, III or IV gain decision. As shown in FIG. 5, after the stage I, II, III, IV status is identified, a respective Gain Decision I, II, III, IV algorithm is implemented. The Gain Decision algorithms determine which gain stages of receiver system 100 need to be adjusted, based on the GCA 112 input signal 136 strength and the ADC 116 output code. After the Gain Decision algorithms determine which gain stages need to be adjusted, the gain update is not immediately implemented. Instead, the gain update will wait on the Flag signal 502, that is controlled by the data processing device (e.g. DSP, micro-controller, or other like device). According to one embodiment, the Flag signal 502 is active low; so the gain is updated when Flag signal 502 is low.

With continued reference now to FIG. 5, following an initial reset of the AGC register 200 as shown in block 504, a determination is first made regarding the status of the GCA register 206 as shown in block 506. If the GCA register 206 has its bit set at "1", a stage I Gain Decision algorithm is implemented as shown in blocks 508 and 510. If the GCA register 206 has its bit set at "0", a determination is then made regarding the status of the Mixer register 204 as shown in block 512. If the Mixer register 204 has its bit set at "1", a stage II Gain Decision algorithm is implemented as shown in blocks 514 and 516. If the Mixer register 204 has its bit set at "0", a determination is then made regarding the status of the LNA register 202 as shown in block 518. If the LNA register 202 has its bit set at "1", a stage III Gain Decision algorithm is implemented as shown in blocks 520 and 522. If the LNA register 202 has its bit set at "0", a stage IV Gain Decision algorithm is then implemented as shown in blocks 524 and 526. Each selected Gain Decision algorithm proceeds to perform a gain update for a respective portion of the receiver system 100 followed by a Gain Register 200 update, as shown in block 530.

FIG. 6 is a flow chart illustrating an algorithmic procedure 600 for implementing the stage I Gain Decision 510 shown in FIG. 5 according to one embodiment of the present invention. An AGC register 200 having every bit set at "1" initiates a stage I Gain Decision since the GCA register 206 then has its bit also set at "1". The stage I Gain Decision algorithmic procedure then commences by first determining the GCA 112 input signal strength V as shown in block 602. If the GCA 112 input signal strength V is greater than V1±ΔV (hysteresis effects), then the Mixer 106 gain is set low, the GCA 112 gain is set to its maximum, and the PGA 114 gain is set to its minimum (M=0, G=0, P=0), as shown in block 604. This completes the transition from Stage I to Stage III, depicted as path 404 in FIG. 4. If however, the GCA 112 input signal strength V is not greater the V1±ΔV, then the Mixer 106 gain is left unchanged (M=1) as shown in block 606; and a decision is made as to whether the ADC 116 output code is equal to, more than, or less than 730±Δ, as shown in block 608. If the ADC 116 output code is equal to 730±Δ, the PGA 114 gain remains unchanged (P=1, G=1) as shown in block 610. Otherwise the PGA 114 gain may be changed as shown as described herein below. The increment or decrement of PGA 114 gain can be a small gain step. It therefore requires several iterations to achieve a stable value. The PGA 114 gain value can actually be calculated as a ratio of difference between the ADC 116 output code and a target code (730 for the instant embodiment, for example) to the code value per 1 dB PGA 114 gain change. Any gain update must wait for the Flag signal 502 as stated herein before. With continued reference to FIG. 6, it can be seen that if the ADC 116 output code is more than 730±Δ, a determination is than made as to whether the PGA 114 gain is at its minimum as shown in block 612. If the PGA 114 gain is at its minimum, then the PGA 114 gain is left unchanged (P=0, G=0), as shown in block 614. If however, the PGA 114 gain is not at its minimum, then it is reduced (P=1, G=1), as shown in block 616. If the ADC 116 output code is less than 730±Δ, as shown in block 608, then a determination is made as to whether the PGA 114 gain is set at its maximum as shown in block 618. If the PGA 114 gain is found to already be at its maximum, then the PGA 114 gain is left unchanged (P=1, G=1), as shown in block 610. If however, the PGA 114 gain is found to be less than its maximum, the PGA 114 gain is then adjusted to its maximum as shown in block 620. This completes the transition from Stage I to Stage II, depicted as path 402 in FIG. 4. As shown in block 622, the LNA register 202 bit is always set at "1", while the remaining registers 204, 206, 208 are updated during a stage I Gain Decision 600.

Figure 7:
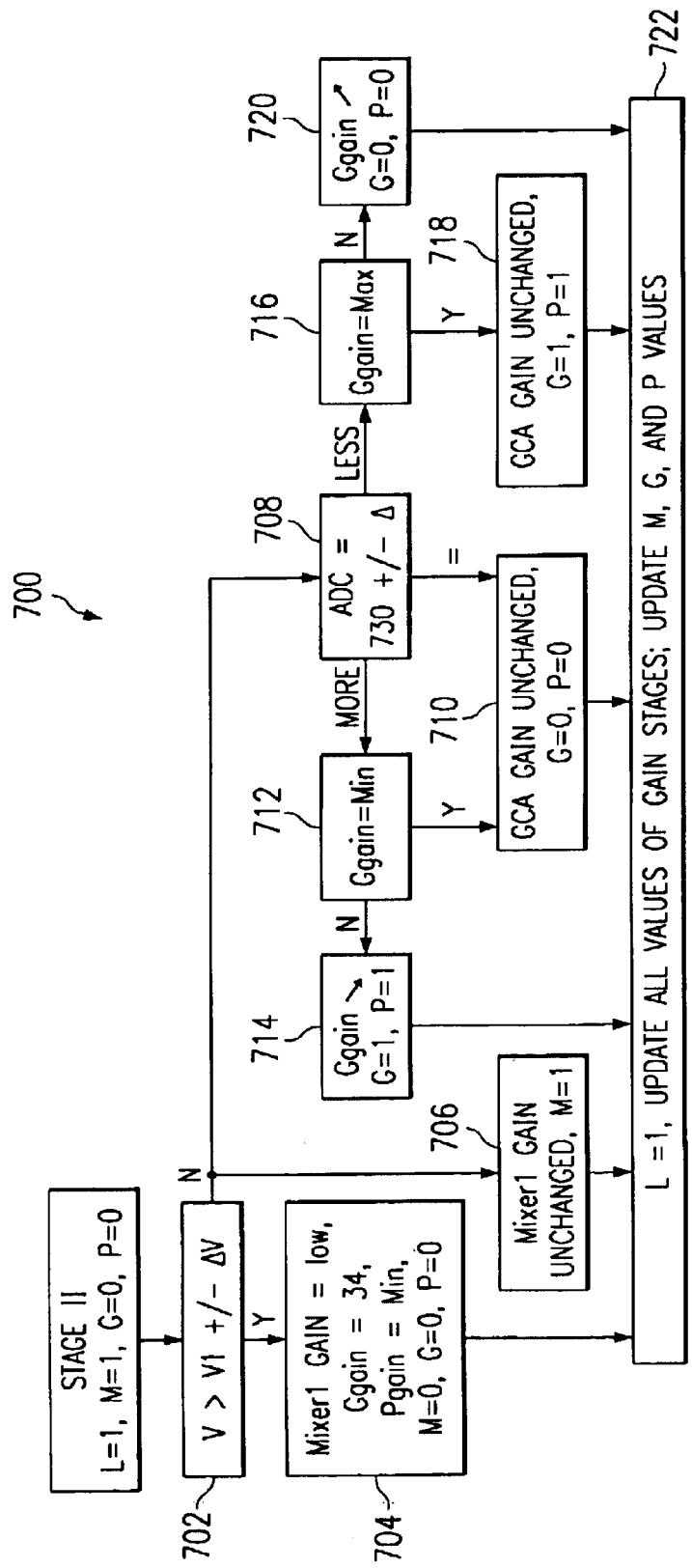
FIG. 7 is a flow chart illustrating an algorithmic procedure for implementing the stage II gain decision shown in FIG. 5 according to one embodiment of the present invention.

FIG. 7 is a flow chart illustrating an algorithmic procedure 700 for implementing the stage II Gain Decision shown in FIG. 5 according to one embodiment of the present invention. An AGC register 200 having the L and M bits set at "1" and the G and P bits set at "0", initiates a stage II Gain Decision. As stated herein before, the analog AGC is controlled by monitoring the GCA 112 input signal and the digital AGC 130 is controlled by monitoring the ADC 116 output code. As shown in Table I, there are two threshold values of GCA 112 input signal to determine the change of either Mixer 106 gain or LNA 102, 104 gain. The threshold values are V1=26 mV or V2=53 mV for both L-Band receive mode and Band III receive mode. The stage II Gain Decision algorithmic procedure 700 then commences by first determining the GCA 112 input signal strength V as shown in block 702. If the GCA 112 input signal strength V is greater than V1±ΔV, then the Mixer 106 gain is set low, the GCA 112 gain is set to 34, and the PGA 114 gain is set to its minimum (M=0, G=0, P=0), as shown in block 704. This completes the transition from stage II to stage III, depicted as path 408 in FIG. 4. If however, the GCA 112 input signal strength V is not greater the V1±ΔV, then the Mixer 106 gain is left unchanged (M=1) as shown in block 706; and a decision is made as to whether the ADC 116 output code is equal to, more than, or less than 730±Δ, as shown in block 708. If the ADC 116 output code is equal to 730±Δ, the GCA 112 gain remains unchanged (G=0, P=0) as shown in block 710. Otherwise the GCA 112 gain may be changed as shown as described herein below. Stage II can transit to stage I (1111) for a weak input signal and to stage III (1000) for a strong input signal. The (1000) transition occurs when the GCA 112 input reaches V1 threshold value. The (1111) transition occurs when the GCA 112 gain reaches maximum value while the ADC 116 output code is still less than the targeted code (e.g. 730). Any gain update must wait for the Flag signal 502 as stated herein before. With continued reference to FIG. 7, it can be seen that if the ADC 116 output code is more than 730±Δ, a determination is than made as to whether the GCA 112 gain is at its minimum as shown in block 712. If the GCA 112 gain is at its minimum, then the GCA 112 gain is left unchanged (G=0, P=0), as shown in block 710. If however, the GCA 112 gain is not at its minimum, then it is reduced (G=1, P=1), as shown in block 714. If the ADC 116 output code is less than 730±Δ, as shown in block 708, then a determination is made as to whether the GCA 112 gain is set at its maximum as shown in block 716. If the GCA 112 gain is found to already be at its maximum, then the GCA 112 gain is left unchanged (G=1, P=1), as shown in block 718. If however, the GCA 112 gain is found to be less than its maximum, the GCA 112 gain is then adjusted upward (G=0, P=0) as shown in block 720. This completes a transition from stage II to stage I, depicted as path 402 in FIG. 4. As shown in block 722, the LNA register 202 bit is always set at "1", while the remaining registers 204, 206, 208 are updated during a stage II Gain Decision 700.

Figure 8:
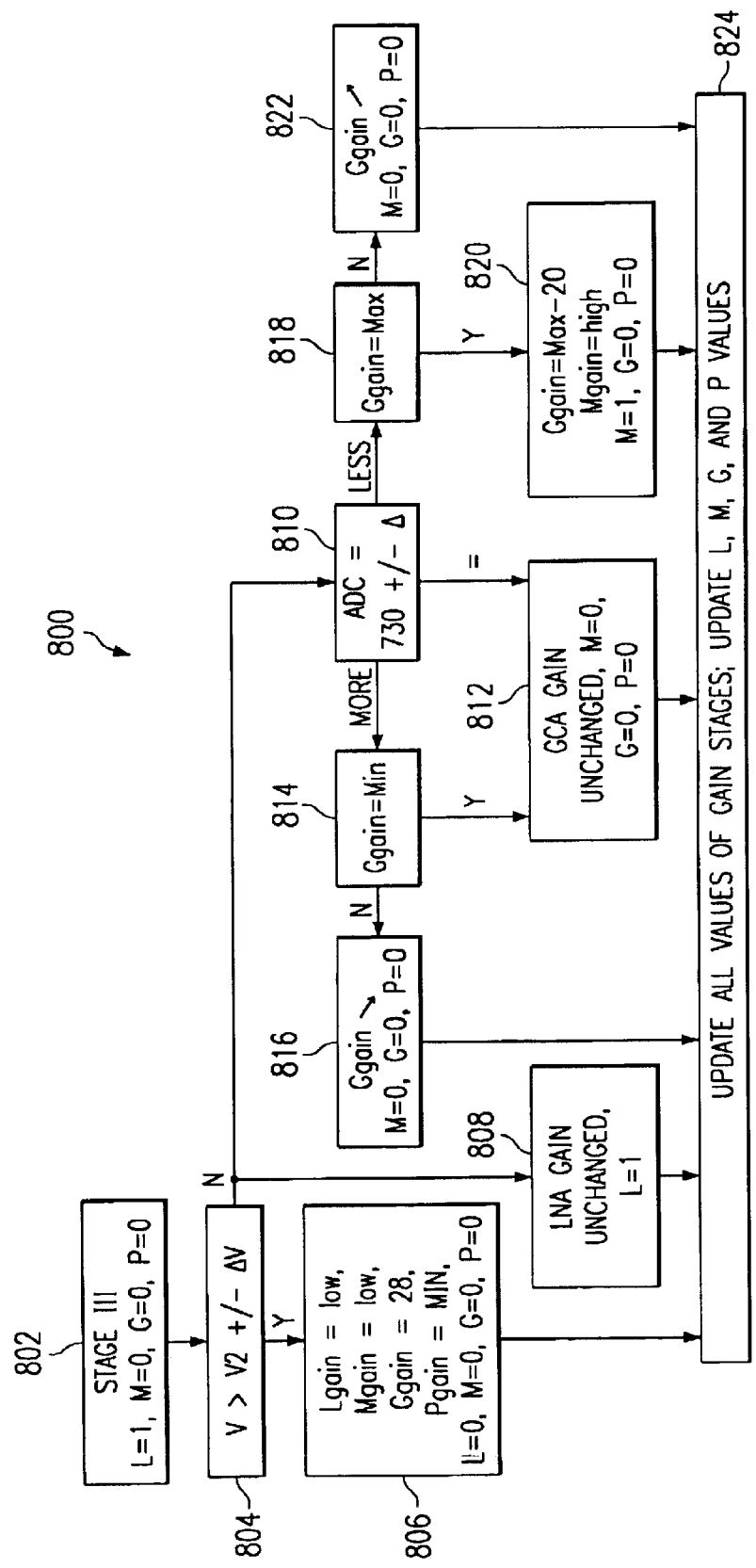
FIG. 8 is a flow chart illustrating an algorithmic procedure for implementing the stage III gain decision shown in FIG. 5 according to one embodiment of the present invention.

FIG. 8 is a flow chart illustrating an algorithmic procedure 800 for implementing the stage III Gain Decision shown in FIG. 5 according to one embodiment of the present invention. An AGC register 200 having the L bits set at "1" and the M, G and P bits set at "0", initiates a stage III Gain Decision as seen in block 802. As stated herein before, the analog AGC is controlled by monitoring the GCA 112 input signal and the digital AGC 116 is controlled by monitoring the ADC 116 output code. As shown in Table I, there are two threshold values of GCA 112 input signal to determine the change of either Mixer 106 gain or LNA 102, 104 gain. The threshold values are V1=26 mV or V2=53 mV for both L-Band receive mode and Band III receive mode. The stage III Gain Decision algorithmic procedure 800 then commences by first determining the GCA 112 input signal strength V as shown in block 804. If the GCA 112 input signal strength V is greater than V2±ΔV, then the Mixer 106 gain is set low, the LNA 102, 104 gain is set low, the GCA 112 gain is set to 28, and the PGA 114 gain is set to its minimum (L=0, M=0, G=0, P=0), as shown in block 806. This completes the transition from stage III to stage IV, depicted as path 406 in FIG. 4. If however, the GCA 112 input signal strength V is not greater the V2±ΔV, then the LNA 102, 104 gain is left unchanged (L=1) as shown in block 808; and a decision is made as to whether the ADC 116 output code is equal to, more than, or less than 730±Δ, as shown in block 810. If the ADC 116 output code is equal to 730±Δ,the GCA 112 gain remains unchanged (M=0, G=0, P=0) as shown in block 812. Otherwise the GCA 112 gain may be changed as shown as described herein below. Any gain update must wait for the Flag signal 502 as stated herein before. With continued reference to FIG. 8, it can be seen that if the ADC 116 output code is more than 730±Δ, a determination is than made as to whether the GCA 112 gain is at its minimum as shown in block 814. If the GCA 112 gain is at its minimum, then the GCA 112 gain is left unchanged (M=0, G=0, P=0), as shown in block 812. If however, the GCA 112 gain is not at its minimum, then it is adjusted downward to its minimum (M=0, G=0, P=0), as shown in block 816. If the ADC 116 output code is less than 730±Δ, as shown in block 810, then a determination is made as to whether the GCA 112 gain is set at its maximum as shown in block 818. If the GCA 112 gain is found to already be at its maximum, then the GCA 112 gain is left unchanged (M=1, G=0, P=0), as shown in block 820. If however, the GCA 112 gain is found to be less than its maximum, the GCA 112 gain is then adjusted to its maximum (M=0, G=0, P=0) as shown in block 822. This completes a transition from stage III to stage II, depicted as path 408 in FIG. 4. As shown in block 824, all registers 202, 204, 206, 208 are updated during a stage III Gain Decision 700.

Figure 9:
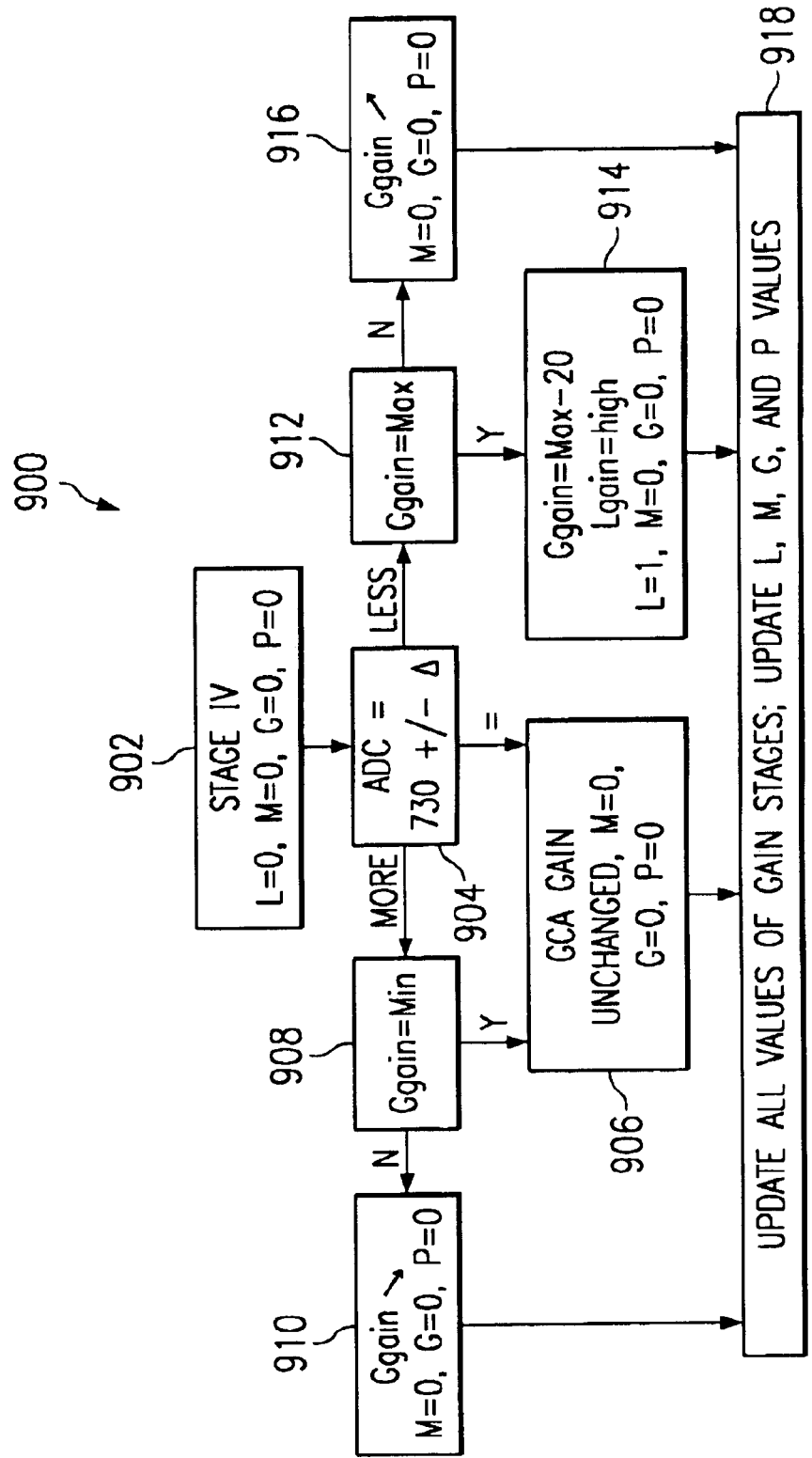
FIG. 9 is a flow chart illustrating an algorithmic procedure for implementing the stage IV gain decision shown in FIG. 5 according to one embodiment of the present invention.

FIG. 9 is a flow chart illustrating an algorithmic procedure 900 for implementing the stage IV gain decision shown in FIG. 5 according to one embodiment of the present invention. An AGC register 200 having the L, M, G and P bits set at "0", initiates a stage IV Gain Decision as seen in block 902. As stated herein before, the analog AGC is controlled by monitoring the GCA 112 input signal and the digital AGC 116 is controlled by monitoring the ADC 116 output code. As shown in Table I, there are two threshold values of GCA 112 input signal to determine the change of either Mixer 106 gain or LNA 102, 104 gain. The threshold values are V1=26 mV or V2=53 mV for both L-Band receive mode and Band III receive mode. The stage IV Gain Decision algorithmic procedure 900 commences by first determining whether the ADC 116 output code is equal to, more than, or less than 730±Δ, as shown in block 904. If the ADC 116 output code is equal to 730±Δ,the GCA 112 gain remains unchanged (M=0, G=0, P=0) as shown in block 906. Otherwise the GCA 112 gain may be changed as shown as described herein below. Any gain update must wait for the Flag signal 502 as stated herein before. With continued reference to FIG. 9, it can be seen that if the ADC 116 output code is more than 730±Δ, a determination is than made as to whether the GCA 112 gain is at its minimum as shown in block 908. If the GCA 112 gain is at its minimum, then the GCA 112 gain is left unchanged (M=0, G=0, P=0), as shown in block 906. If however, the GCA 112 gain is not at its minimum, then it is adjusted downward to its minimum (M=0, G=0, P=0), as shown in block 910. If the ADC 116 output code is less than 730±Δ, as shown in block 810, then a determination is made as to whether the GCA 112 gain is set at its maximum as shown in block 912. If the GCA 112 gain is found to already be at its maximum, then the GCA 112 gain is set at a value of Max=20 dB and the LNA 102, 106 gain is set high (L=1, M=0, G=0, P=0), as shown in block 914. This completes the transition from stage IV to stage III, depicted as path 406 in FIG. 4. If however, the GCA 112 gain is found to be less than its maximum, the GCA 112 gain is then adjusted to its maximum (M=0, G=0, P=0) as shown in block 916. As shown in block 918, all registers 202, 204, 206, 208 are updated during a stage IV Gain Decision 900.

In summary explanation of the above, the present invention is directed to digital radio receiver architecture 100 and an algorithmic technique 500, 600, 700, 800, 900 to achieve high input signal sensitivity and high linearity over a wide range of RF input signal strengths at both band III and L-band antennas, among other things. The technique uses algorithmic software to implement program-based automatic gain control to ensure and obtain an optimum system signal-to-noise ratio. High/low gain mode switches associated with LNAs 102, 104 and mixers 106, 108, 110 are controlled by a RF AGC, while a digital AGC 130 controls the gain settings of a GCA 112 and a PGA 114 to optimize the PGA 114 output signal to a desired ADC 116 input range.

This invention has been described in considerable detail in order to provide those skilled in the equalizer art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of implementing dual mode automatic gain control for a digital radio receiver, the method comprising the steps of:

(a) providing a RF broadcast receiver having an IF gain controlled amplifier (GCA), a programmable gain amplifier (PGA), a digital automatic gain control (AGC) configured to control GCA gain and PGA gain in response to at least a digital output code that is determined partially by PGA output signal strength, at least one low noise amplifier (LNA), at least one down converter (Mixer), and an analog AGC configured to control LNA gain and Mixer gain in response to at least a GCA input signal;

(b) providing a gain control register having a LNA control bit, a Mixer control bit, a GCA control bit, and a PGA control bit;

(c) resetting the gain control register bits to an initial state; and (d) adjusting LNA gain and Mixer gain via the analog AGC in response to the control register bit setting and the GCA input signal and further adjusting GCA gain and PGA gain via the digital AGC in response to the control register bit setting and the digital output code such that the LNA gain, Mixer gain, GCA gain and PGA gain combine to render the RF broadcast receiver capable of maximizing its signal-to-noise ratio and linearity to accommodate reception and amplification of L-band signals and band-III signals.

2. The method of implementing dual mode automatic gain control for a digital radio receiver according to claim 1 further comprising the steps of:

(e) adjusting the gain control register bits to a state determined by LNA gain, Mixer gain, GCA gain and PGA gain; and (f) repeating steps (d) and (e) for a desired period of time.

3. The method of implementing dual mode automatic gain control according to claim 1 wherein the step (d) of adjusting LNA gain, Mixer gain, GCA gain and PGA gain further comprises the steps of:

implementing a first algorithmic gain decision procedure when the gain control register bits are all set to one;

implementing a second algorithmic gain decision procedure when the gain control register LNA and Mixer bits are set to one and the gain control register GCA and PGA bits are set to zero;

implementing a third algorithmic gain decision procedure when the gain control register LNA bit is set to one and the gain control register Mixer, GCA and PGA bits are set to zero; and implementing a fourth algorithmic gain decision procedure when the gain control register bits are all set to zero.

4. The method of implementing dual mode automatic gain control according to claim 3 wherein the step of implementing a first algorithmic gain decision procedure when the gain control register bits are all set to one comprises the step of setting the Mixer gain low, the GCA gain to its maximum, the PGA gain to its minimum, and leaving the LNA gain unchanged when the GCA input signal exceeds a predetermined voltage level.

5. The method of implementing dual mode automatic gain control according to claim 3 wherein the step of implementing a first algorithmic gain decision procedure when the gain control register bits are all set to one comprises the step of leaving the LNA gain, the Mixer gain, the GCA gain and the PGA gain unchanged when the GCA input signal does not exceed a predetermined voltage level and the digital output code is equal to a predetermined code value.

6. The method of implementing dual mode automatic gain control according to claim 3 wherein the step of implementing a first algorithmic gain decision procedure when the gain control register bits are all set to one comprises the step of leaving the LNA gain, the Mixer gain, the GCA gain and the PGA gain unchanged when the GCA input signal does not exceed a predetermined voltage level, the digital output code is less than a predetermined code value, and the PGA gain is set to its maximum value.

7. The method of implementing dual mode automatic gain control according to claim 3 wherein the step of implementing a first algorithmic gain decision procedure when the gain control register bits are all set to one comprises the step of leaving the LNA gain, the Mixer gain and the GCA gain unchanged and adjusting the PGA gain to its maximum when the GCA input signal does not exceed a predetermined voltage level, the digital output code is less than a predetermined code value, the GCA gain is set to its maximum, and the PGA gain is not set at its maximum.

8. The method of implementing dual mode automatic gain control according to claim 3 wherein the step of implementing a first algorithmic gain decision procedure when the gain control register bits are all set to one comprises the step of leaving the LNA gain, the Mixer gain and the GCA gain unchanged and adjusting the PGA gain to its minimum when the GCA input signal does not exceed a predetermined voltage level, the digital output code is greater than a predetermined value, the GCA gain is set to its maximum, and the PGA gain is not set at its minimum.

9. The method of implementing dual mode automatic gain control according to claim 4 wherein the step of implementing a first algorithmic gain decision procedure when the gain control register bits are all set to one comprises the step of leaving the LNA gain, the Mixer gain, the GCA gain and the PGA gain unchanged when the GCA input signal does not exceed a predetermined voltage level, the digital output code is greater than a predetermined code value, and the GCA gain and PGA gain are each set to its respective minimum.

10. The method of implementing dual mode automatic gain control according to claim 3 wherein the step of implementing a second algorithmic gain decision procedure when the gain control register LNA and Mixer bits are set to one and the gain control register GCA and PGA bits are set to zero comprises the step of leaving the LNA gain unchanged, setting the Mixer gain low, setting the PGA gain to its minimum, and setting the GCA gain to a first predetermined GCA gain level when the GCA input signal exceeds a predetermined voltage level.

11. The method of implementing dual mode automatic gain control according to claim 3 wherein the step of implementing a second algorithmic gain decision procedure when the gain control register LNA and Mixer bits are set to one and the gain control register GCA and PGA bits are set to zero comprises the step of leaving the LNA gain, the Mixer gain, the PGA gain, and the GCA gain unchanged when the GCA input signal does not exceed a predetermined voltage level and the digital output code is equal to a predetermined code value.

12. The method of implementing dual mode automatic gain control according to claim 3 wherein the step of implementing a second algorithmic gain decision procedure when the gain control register LNA and Mixer bits are set to one and the gain control register GCA and PGA bits are set to zero comprises the step of leaving the LNA gain, the Mixer gain, the PGA gain, and the GCA gain unchanged when the GCA input signal does not exceed a predetermined voltage level, the digital output code is greater than a predetermined code value, and the PGA gain and GCA gain are each set to its respective minimum value.

13. The method of implementing dual mode automatic gain control according to claim 3 wherein the step of implementing a second algorithmic gain decision procedure when the gain control register LNA and Mixer bits are set to one and the gain control register GCA and PGA bits are set to zero comprises the step of leaving the LNA gain, the Mixer gain, the PGA gain, and the GCA gain unchanged when the GCA input signal does not exceed a predetermined voltage level, the digital output code is less than a predetermined value, and the PGA gain and GCA gain are each set to their respective maximum values.

14. The method of implementing dual mode automatic gain control according to claim 3 wherein the step of implementing a second algorithmic gain decision procedure when the gain control register LNA and Mixer bits are set to one and the gain control register GCA and PGA bits are set to zero comprises the step of leaving the LNA gain and the Mixer gain, and adjusting the GCA gain to its maximum when the GCA input signal does not exceed a predetermined voltage level, the digital output code is less than a predetermined code value, and the PGA gain is set to its minimum value.

15. The method of implementing dual mode automatic gain control according to claim 3 wherein the step of implementing a second algorithmic gain decision procedure when the gain control register LNA and Mixer bits are set to one and the gain control register GCA and PGA bits are set to zero comprises the step of leaving the LNA gain and the Mixer gain, and adjusting the GCA gain to its minimum when the GCA input signal does not exceed a predetermined voltage level, the digital output code is greater than a predetermined code value, and the PGA gain is set to its maximum value.

16. The method of implementing dual mode automatic gain control according to claim 3 wherein the step of implementing a third algorithmic gain decision procedure when the gain control register LNA bit is set to one and the gain control register Mixer bits, GCA bits and PGA bits are set to zero comprises the step of setting the LNA gain low, setting the Mixer gain low, setting the GCA gain at a predetermined GCA gain value, and setting the PGA gain at its minimum value when the GCA input signal exceeds a predetermined voltage level.

17. The method of implementing dual mode automatic gain control according to claim 3 wherein the step of implementing a third algorithmic gain decision procedure when the gain control register LNA bit is set to one and the gain control register Mixer, GCA and PGA bits are set to zero comprises the step of leaving the LNA gain and the GCA gain unchanged when the GCA input signal exceeds a predetermined voltage level, the digital output code is equal to a predetermined code value, the Mixer gain is set to its minimum, the PGA gain is set to its minimum, and the GCA gain is set to its minimum.

18. The method of implementing dual mode automatic gain control according to claim 3 wherein the step of implementing a third algorithmic gain decision procedure when the gain control register LNA bit is set to one and the gain control register Mixer, GCA and PGA bits are set to zero comprises the step of leaving the LNA gain and the GCA gain unchanged when the GCA input signal exceeds a predetermined voltage level, the digital output code is more than a predetermined code value, the Mixer gain is set to its minimum, the PGA gain is set to its minimum, and the GCA gain is set to its minimum.

19. The method of implementing dual mode automatic gain control according to claim 3 wherein the step of implementing a third algorithmic gain decision procedure when the gain control register LNA bit is set to one and the gain control register Mixer, GCA and PGA bits are set to zero comprises the step of leaving the LNA gain unchanged, setting the Mixer gain low, setting the PGA gain low, and adjusting the GCA gain to its minimum when the GCA input signal exceeds a predetermined voltage level and the digital output code is more than a predetermined code value.

20. The method of implementing dual mode automatic gain control according to claim 3 wherein the step of implementing a third algorithmic gain decision procedure when the gain control register LNA bit is set to one and the gain control register Mixer, GCA and PGA bits are set to zero comprises the step of leaving the LNA gain unchanged, setting the Mixer gain low, setting the PGA gain low, and adjusting the GCA gain to its maximum when the GCA input signal exceeds a predetermined voltage level, the digital output code is less than a predetermined code value, and the GCA gain is not at its maximum.

21. The method of implementing dual mode automatic gain control according to claim 3 wherein the step of implementing a third algorithmic gain decision procedure when the gain control register LNA bit is set to one and the gain control register Mixer, GCA and PGA bits are set to zero comprises the step of leaving the LNA gain unchanged, setting the Mixer gain high, setting the PGA gain low, and setting the GCA gain to a predetermined level less than its maximum when the GCA input signal exceeds a predetermined voltage level, the digital output code is less than a predetermined code value, and the GCA gain is at its maximum.

22. The method of implementing dual mode automatic gain control according to claim 3 wherein the step of implementing a fourth algorithmic gain decision procedure when the gain control register LNA, Mixer, GCA and PGA bits are set to zero comprises the step of leaving the LNA gain, the Mixer gain, the GCA gain, and the PGA gain unchanged when the digital output code is more than a predetermined code value, and the GCA gain is at its minimum.

23. The method of implementing dual mode automatic gain control according to claim 3 wherein the step of implementing a fourth algorithmic gain decision procedure when the gain control register LNA, Mixer, GCA and PGA bits are set to zero comprises the step of leaving the LNA gain, the Mixer gain, the GCA gain, and the PGA gain unchanged when the digital output code is equal to a predetermined code value.

24. The method of implementing dual mode automatic gain control according to claim 3 wherein the step of implementing a fourth algorithmic gain decision procedure when the gain control register LNA, Mixer, GCA and PGA bits are set to zero comprises the step of leaving the LNA gain, the Mixer gain, and the PGA gain unchanged, and adjusting the GCA gain to its minimum when the digital output code is more than a predetermined code value, and the GCA gain is not at its minimum.

25. The method of implementing dual mode automatic gain control according to claim 3 wherein the step of implementing a fourth algorithmic gain decision procedure when the gain control register LNA, Mixer, GCA and PGA bits are set to zero comprises the step of leaving the LNA gain, the Mixer gain, the GCA gain, and the PGA gain unchanged, and adjusting the GCA gain to its maximum when the digital output code is less than a predetermined code value, and the GCA gain is not at its maximum.

26. The method of implementing dual mode automatic gain control according to claim 3 wherein the step of implementing a fourth algorithmic gain decision procedure when the gain control register LNA, Mixer, GCA and PGA bits are set to zero comprises the step of leaving the Mixer gain and PGA gain unchanged, setting the GCA gain to a predetermined level less than its maximum, and setting the LNA gain to its maximum when the digital output code is less than a predetermined code value, and the GCA gain is at its maximum.

27. A digital radio receiver comprising:
- a IF gain controlled amplifier (GCA) having a variable gain;
- a programmable gain amplifier (PGA) having a variable gain;
- at least one low noise amplifier (LNA) having a variable gain;
- at least one down converter (Mixer) having a variable gain;
- a digital automatic gain control (AGC); and
- a gain control register bit map having a GCA control bit, a PGA control bit, a LNA control bit, and a Mixer control bit, wherein the AGC is responsive to the gain control register bit map to enable a plurality of AGC states such that the digital radio receiver can maximize its signal-to-noise ratio and linearity to accommodate reception and amplification of L-band signals and band-III signals.

28. The digital radio receiver according to claim 27 wherein the plurality of AGC states is determined in response to the PGA gain, the LNA gain, the Mixer gain and the AGC gain.

29. The digital radio receiver according to claim 27 wherein the plurality of AGC states comprise:
- a first gain stage when the gain control register bits are all set to a first state;
- a second gain stage when the gain control register bits are all set to a second state;
- a third gain stage when the gain control register bits are all set to a third state; and
- a fourth gain stage when the gain control register bits are all set to a fourth state.

30. The digital radio receiver according to claim 29 wherein the first state is implemented when the gain control register bits are all set to one, the second state is implemented when the gain control register LNA and Mixer bits are set to one and the gain control register GCA and PGA bits are set of zero, the third state is implemented when the gain control register LNA bit is set to one and the gain control register Mixer, GCA and PGA bits are set to zero, and the fourth state is implemented when the gain control register bits are all set to zero.

* * * * *